(12) United States Patent
Lee

(10) Patent No.: US 6,940,325 B2
(45) Date of Patent: Sep. 6, 2005

(54) DLL CIRCUIT

(75) Inventor: Jae Jin Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/672,990

(22) Filed: Sep. 26, 2003

(65) Prior Publication Data

US 2004/0212413 A1 Oct. 28, 2004

(30) Foreign Application Priority Data

Apr. 23, 2003 (KR) .............................. 10-2003-0025772

(51) Int. Cl.[7] .............................................. H03L 7/06
(52) U.S. Cl. ...................................... 327/158; 327/31
(58) Field of Search ............................. 327/26, 36, 31, 327/149, 153, 158, 161

(56) References Cited

U.S. PATENT DOCUMENTS

| | | | | |
|---|---|---|---|---|
| 5,323,423 A | * | 6/1994 | Townsend et al. ........... | 375/232 |
| 5,327,103 A | * | 7/1994 | Baron et al. ................. | 331/1 A |
| 5,940,609 A | | 8/1999 | Harrison ..................... | 395/558 |
| 5,969,551 A | | 10/1999 | Fujioka ....................... | 327/149 |
| 6,119,242 A | | 9/2000 | Harrison ..................... | 713/503 |
| 6,201,424 B1 | | 3/2001 | Harrison ..................... | 327/158 |
| 6,525,988 B2 | | 2/2003 | Ryu et al. .................... | 365/233 |
| 2003/0001637 A1 | | 1/2003 | Jung ........................... | 327/158 |

FOREIGN PATENT DOCUMENTS

| | | | |
|---|---|---|---|
| JP | 11068559 A | * 3/1999 | ............ H03L/7/08 |
| JP | 11 086545 | 6/1999 | |
| JP | 11 202969 | 9/1999 | |
| JP | 2000 163999 | 6/2000 | |
| JP | 2002 314407 | 7/2002 | |

* cited by examiner

*Primary Examiner*—Linh My Nguyen
(74) *Attorney, Agent, or Firm*—Ladas & Parry LLP

(57) ABSTRACT

A DLL circuit synchronizes an external input clock applied from an outside of a system with an internal input clock used inside the system using a divider unit. The DLL circuit includes a detection unit for detecting whether a pulse width of the external input clock is narrower than a reference set value. The divider unit outputs a first divided signal when it is detected that the pulse width of the external input clock is wider than the reference set value, and outputs a second divided signal when it is detected that the pulse width of the external input clock is shorter than the reference set value. The DLL circuit can normally operate even when the period of the external input clock is short.

8 Claims, 14 Drawing Sheets

DLL CIRCUIT

BACKGROUND OF THE INVENTION

1. Field of the Invention

The present invention relates to a DLL (Delay Lock Loop) circuit used in a DDR SDRAM, and more particularly to a DLL circuit that is operable even if the frequency of an external clock inputted to the DLL circuit is high.

2. Description of the Prior Art

As generally known in the art, in the DDR SDRAM, a DLL circuit, which is an internal clock generating circuit, is used in order to synchronize an output time of data with an externally inputted clock (e.g., external clock). That is, since a time delay occurs due to internal circuits in the case that the externally inputted clock is used as an internal clock, the DLL circuit is used to make the internal clock and the external clock have the same phase in order to compensate for the time delay. In other words, the DLL circuit is used to cause data to be outputted in synchronization with the external clock.

FIG. 1 is a block diagram of a general DLL circuit.

As illustrated in FIG. 1, the DLL circuit includes a clock buffer 10 for receiving an external clock signal, a delay circuit 20 for receiving an output signal of the clock buffer 10, a clock divider 50 for dividing the output signal of the clock buffer 10, a dummy delay circuit 60 for delaying an output signal of the clock divider 50 for a predetermined time, a replica delay unit 90 for delaying an output signal of the dummy delay circuit 60, a phase comparator 70 for comparing a phase of an output signal of the replica delay unit 90 with a phase of the output signal of the clock divider 50, a delay controller 80 for receiving an output signal of the phase comparator 70 and controlling delay operations of the delay circuit 20 and the dummy delay circuit 60, and a clock signal line 30 for receiving an output signal of the delay circuit 20 and controlling a data output of an output buffer 40.

The clock buffer 10 is a buffer circuit that converts the potential level of the externally inputted clock signal into a potential level used in the DDR SDRAM.

The delay circuit 20 is a delay line that receives the output signal (which is used as the internal clock) of the clock buffer 10, and changes the delay time of the received clock signal. An example of the delay circuit 20 is illustrated in FIG. 2, and as illustrated, it includes a plurality of unit delay circuits.

The clock signal line 30 is a clock driving device that receives the output signal of the delay circuit 20, and generates a driving signal for driving the data output buffer 40.

The output buffer 40 outputs the data transferred from a data bus to an external output terminal in response to the driving signal from the clock signal line 30.

The clock divider 50 divides the frequency of the clock signal outputted from the clock buffer 10 into 1/n, and generates a specified reference clock (generally, n is an integer, i.e., 4, 8 or 16). That is, the clock divider 50 divides the frequency of the internal clock into $\frac{1}{2}^M$ (here, M is the number of unit dividers provided in the clock divider).

The dummy delay circuit 60 is a delay line that receives the reference clock outputted from the clock divider, and changes the delay time of the reference clock. It is general that the dummy delay circuit 60 has the same structure as the delay circuit 20.

The replica delay unit 90 is a delay unit that has a time delay existing from the input of the clock signal to the DLL circuit to the output of the data through the data output buffer.

The phase comparator 70 compares the phase of the output signal of the clock divider 50 with the phase of the output signal of the replica delay unit 90, and controls the delay controller 80. That is, the phase comparator 70 compares the difference of time delay of the two received signals, and generates a signal for controlling the delay controller 80 that is composed of registers. For reference, FIGS. 4 and 6 illustrate the delay controller 80 and the phase comparator 70, respectively, and as illustrated, the delay controller 80 is controlled by output signals left1, left2, right1 and right2 of the phase comparator 70.

The delay controller 80 illustrated in FIG. 4 is composed of registers for controlling a unit delay in respective delay lines which constitute the delay circuit 20 and the dummy delay circuit 60. The delay controller 80 adjusts the delay time of the delay circuit 20 and the dummy delay circuit 60, and respective register values are controlled by the output signals of the phase comparator 70.

Hereinafter, the construction of a conventional DLL circuit will be explained in more detail.

FIG. 2 illustrates an example of a general delay circuit 20 illustrated in FIG. 1. As shown in FIG. 2, the delay circuit 20 includes a plurality of unit delays which are controlled by the delay controller. The output signal of the clock buffer 10 is applied to the respective unit delays. The respective unit delay includes a first NAND gate for receiving the output signal of the clock buffer 10 and the output signal of the delay controller 80, a second NAND gate for receiving an output signal of the preceding unit delay and an output signal of the first NAND gate, and an inverter for inverting an output signal of the second NAND gate. To input terminals of the second NAND gate of the first unit delay, an output signal of the first NAND gate and a power supply voltage Vdd are inputted.

In operation, it is assumed that to the input terminals of the first NAND gate of the second unit delay, the output signal of the clock buffer 10 and a register signal of the delay controller are inputted.

If the register signal is high in logic, the unit delay is enabled, and transfers the clock signal (i.e., CLK of FIG. 2) that is the output signal of the clock buffer 10.

If the register signal is low in logic, the output signal of the unit delay becomes high in logic, and is applied to the second NAND gate. Thus, a unit delay signal of the first unit delay is transferred to the following unit delay through the second NAND gate. In this case, a predetermined time delay occurs in the second NAND gate, and the inverter of the unit delay causes the same time delay as the second NAND gate. For reference, the dummy delay circuit 60 has the same construction as the delay circuit 20 as described above.

FIG. 3 illustrates the delay circuit 20 and the dummy delay circuit 60, which have a plurality of unit delays. In FIG. 3, a unit delay block UD denotes the unit delay of FIG. 2. The respective unit delays in the delay circuit 20 and the dummy delay circuit 60 are controlled through the delay controller 80 as described above.

FIG. 4 illustrates an example of a delay control circuit. Diverse modifications of such a delay control circuit, all having the same function, can be implemented by those skilled in the art.

FIG. 5 illustrates an example of the clock buffer 10 and the clock divider 50. The clock buffer 10 is a differential comparator circuit that receives externally inputted clock signals eclk and /eclk, and generates an internal clock signal. Generally, the clock buffer 10 is composed of a first clock buffer and a second clock buffer. The first clock buffer receives the external clock, and outputs the internal clock that is generated in synchronization with a rising edge of the external clock. The second clock buffer receives the external clock, and outputs the internal clock that is generated in synchronization with a falling edge of the external clock. The construction and operation of the clock buffer 10 are well known in the art, and a further explanation thereof will be omitted.

The clock divider 50 illustrated in FIG. 5 includes first to third dividers 51, 52 and 53, which are connected in series. That is, an output signal of the first divider 51 is applied to an input terminal of the second divider 52, and an output signal of the second divider 52 is applied to an input terminal of the third divider 53.

The first divider 51 receives the internal clock CLK, which is the output signal of the clock buffer 10, and outputs the clock signal Clk_1, which is obtained by dividing the frequency of the internal clock into ½. The second divider 52 outputs the clock signal Clk_2, which is obtained by dividing the frequency of the output signal Clk_1 of the first divider into ½. Accordingly, the frequency of the output signal of the second divider is ¼ of the frequency of the internal clock. The third divider 53 outputs the clock signal Clk_3, which is obtained by dividing the frequency of the output signal Clk_2 of the second divider 52 into ½. Accordingly, the frequency of the output signal of the third divider is ⅛ of the frequency of the internal clock. The construction, modification and operation of the clock divider 50 are well known in the art, and a further explanation thereof will be omitted.

FIG. 6 illustrates an example of the phase comparator 70 of FIG. 1. The phase comparator 70 compares the output signal Clk_3 of the clock divider 50 with an output signal Clk_delay of the replica delay unit 90, and reduces the time difference between two output signals. In other words, the phase comparator 70 controls a moving direction of registers in the delay controller by comparing the output signal Clk_3 of the clock divider 50 with the output signal Clk_delay of the replica delay unit 90. The phase comparator 70 continues the comparing work until the rising edge of the output signal of the clock divider 50 is synchronized with the rising edge of the output signal of the replica delay unit 90, and the phase difference between them becomes 0. The output signals left1, left2, right1 and right2 of the phase comparator 70 are used to control the delay controller 80 composed of registers.

FIG. 7 is a timing diagram explaining the operation of the phase comparator of FIG. 6.

Referring to FIGS. 6 and 7, the clock signal Clk_3 represents the output signal of the clock divider (of FIG. 5) that divided the internal clock into ⅛, and the clock signal ref represents an inverted signal of the clock signal Clk_3 as illustrated in FIG. 6. The clock signal Clk_delay is the output signal of the replica delay unit 90.

The left part of FIG. 7 shows a case in which the rising edge of the clock signal Clk_delay is faster than the rising edge of the clock signal ref. In this case, an added delay becomes in a high level, and this controls the controller in a direction in which the delay time increases. That is, the shift left signal left1 becomes a high level.

The right part of FIG. 7 shows a case in which the rising edge of the clock signal Clk_delay is later than the rising edge of the clock signal ref. In this case, a reduced delay becomes in a high level, and this controls the controller in a direction in which the delay time decreases. That is, the shift left signal left2 becomes a high level.

FIG. 8 is a timing diagram of the conventional delay circuit.

In FIG. 8, TCK denotes a period of the clock signal, and T1 denotes a delay time occurring as the externally inputted clock passes through the clock buffer.

T2 denotes a delay time occurring from the input of the external clock to the output of the data, and is the same as the delay time of the delay unit 90.

Td denotes a delay time which should be adjusted in the delay circuit 20 by the delay controller 80.

CLK_DLL denotes the output signal of the clock signal line 30 which controls the data output buffer 40, and dout denotes data which is outputted from the data output buffer 40.

CLK_3 and CLK_3b denote final output signals of the clock divider, and CLK_3 delay denotes the output signal of the replica delay unit.

Generally, the DLL circuit, in order to output the data in synchronization with the external input clock, applies the clock signal, which passed through the clock buffer, to the clock divider, and compares the phase of the output signal of the clock divider with the phase of the signal, which was outputted from the clock divider and passed through the specified delay means (i.e., dummy delay circuit and replica delay unit). Based on this, the phase comparator controls the delay controller to repeat the adjustment of the delay time Td occurring in the dummy delay circuit and the delay circuit.

However, as shown in FIG. 8, the conventional delay circuit causes no problem in a case in which the delay time T2 in the replica delay unit is shorter than the period TCK of the external input clock, but cannot perform a normal operation in the case in which the period of the external input clock is shorter than the delay time in the replica delay circuit.

In other words, in the case where the period TCK of the external input clock (e.g., pulse width of the external input clock) is longer than the delay time of the replica delay circuit, the conventional delay circuit can output the clock signal synchronized with the external signal by adjusting the delay time in the dummy delay circuit 60, but in the case where the period TCK of the external input clock is shorter than the delay time of the replica delay circuit, the clock signal delayed as long as the delay time in the replica delay circuit would be applied to the phase comparator even if the delay time in the dummy delay circuit is 0, and in this case, the conventional delay circuit cannot generate the clock signal synchronized with the external signal.

SUMMARY OF THE INVENTION

Accordingly, the present invention has been made to solve the above-mentioned problems occurring in the prior art, and an object of the present invention is to provide a DLL circuit which can normally operate even if the period of the external input clock is shorter than the delay time of the replica delay circuit.

In order to accomplish this object, there is provided a DLL (Delay Lock Loop) circuit which synchronizes an external input clock applied from an outside of a system with an internal input clock used inside the system using a divider unit, the DLL circuit comprising a detection unit for detecting whether a pulse width of the external input clock is narrower than a reference set value, wherein the divider unit outputs a first divided signal if it is detected that the pulse width of the external input clock is wider than the reference set value, and outputs a second divided signal if it is detected that the pulse width of the external input clock is narrower than the reference set value.

In the embodiment of the present invention, a pulse width of the first divided signal is narrower than a pulse width of the second divided signal.

In another aspect of the present invention, there is provided a DLL (Delay Lock Loop) circuit which synchronizes an external input clock applied from an outside of a system with an internal input clock used inside the system, the DLL circuit comprising a buffer means for receiving and buffering the external input clock, a detection means for detecting whether a period of an output signal of the buffer means exceeds a first delay time, and a divider means for receiving the output signal of the buffer means and an output signal of the detection means and dividing frequencies of the output signals.

In the embodiment of the present invention, if the period of the output signal of the buffer means exceeds the first delay time, the detection means outputs a first logic level, and the divider means outputs a signal having a frequency obtained by dividing the frequency of the output signal of the buffer means into $½^M$ (where, M is an integer), while if the period of the output signal of the buffer means does not exceed the first delay time, the detection means outputs a second logic level, and the divider means outputs a signal having a frequency obtained by dividing the frequency of the output signal of the buffer means into $½^{M+1}$.

In the embodiment of the present invention, the first delay time is determined under the control of the DLL circuit in consideration of a time taken from an input of the external input clock to an output of data from a system employing the DLL circuit.

In the embodiment of the present invention, the external input clock and the output signal of the buffer means have the same period and the same duty rate, the duty rate is 50%, and the detection means uses a high-level pulse width of the output signal of the buffer means in order to detect whether the period of the output signal of the buffer means exceeds the first delay time.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
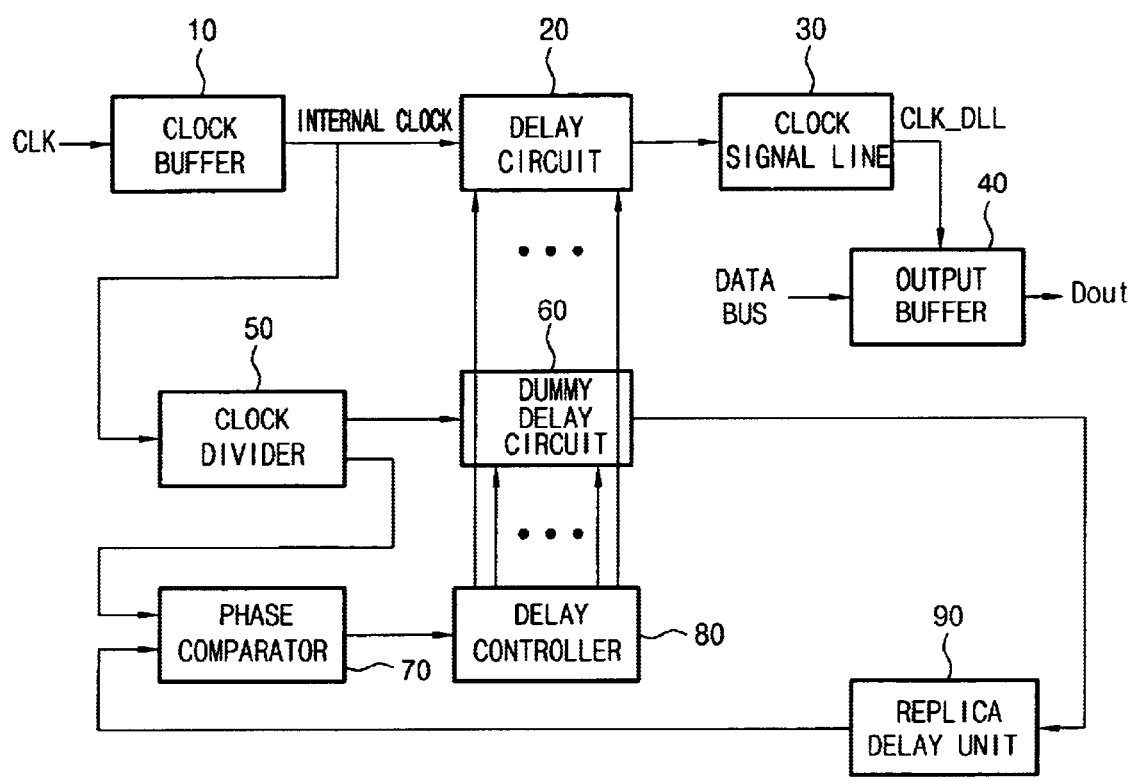
FIG. 1 is a block diagram of a general DLL circuit.
Figure 2:
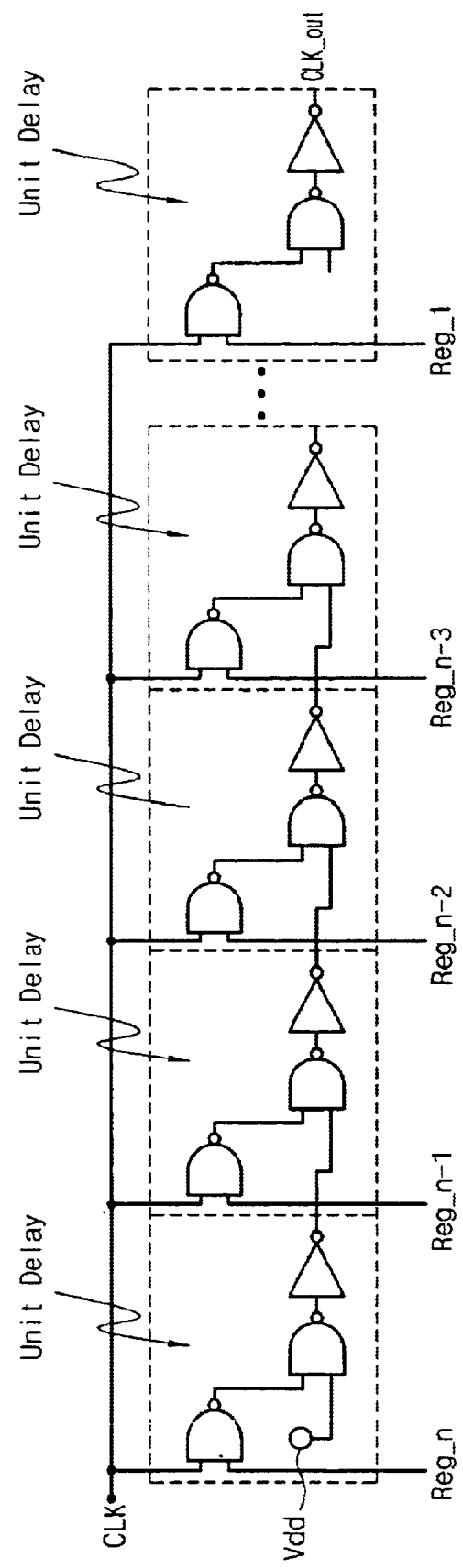
FIG. 2 illustrates an example of a delay circuit illustrated in FIG. 1.
Figure 3:
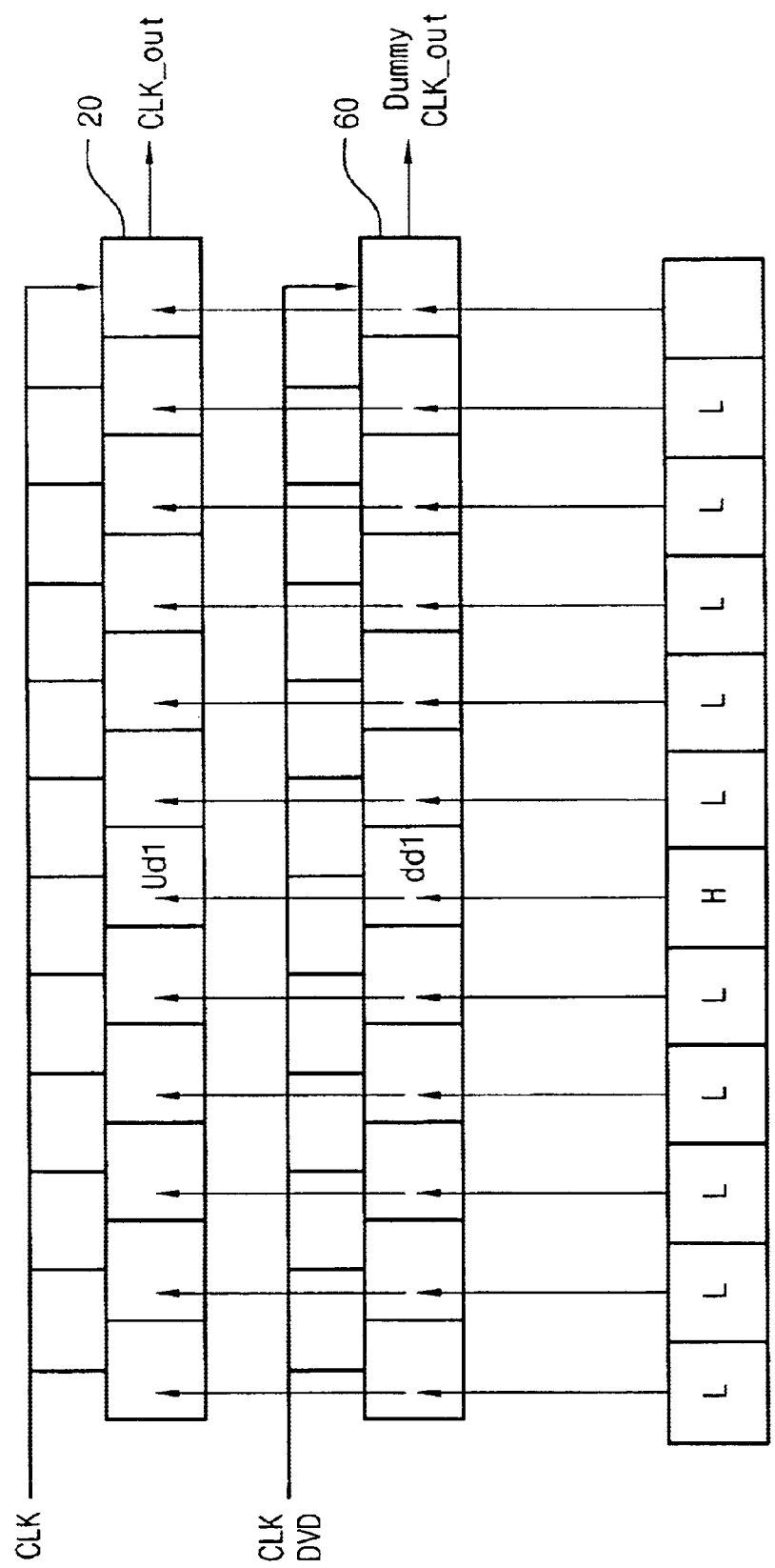
FIG. 3 illustrates another example of a delay circuit illustrated in FIG. 1.
Figure 4:
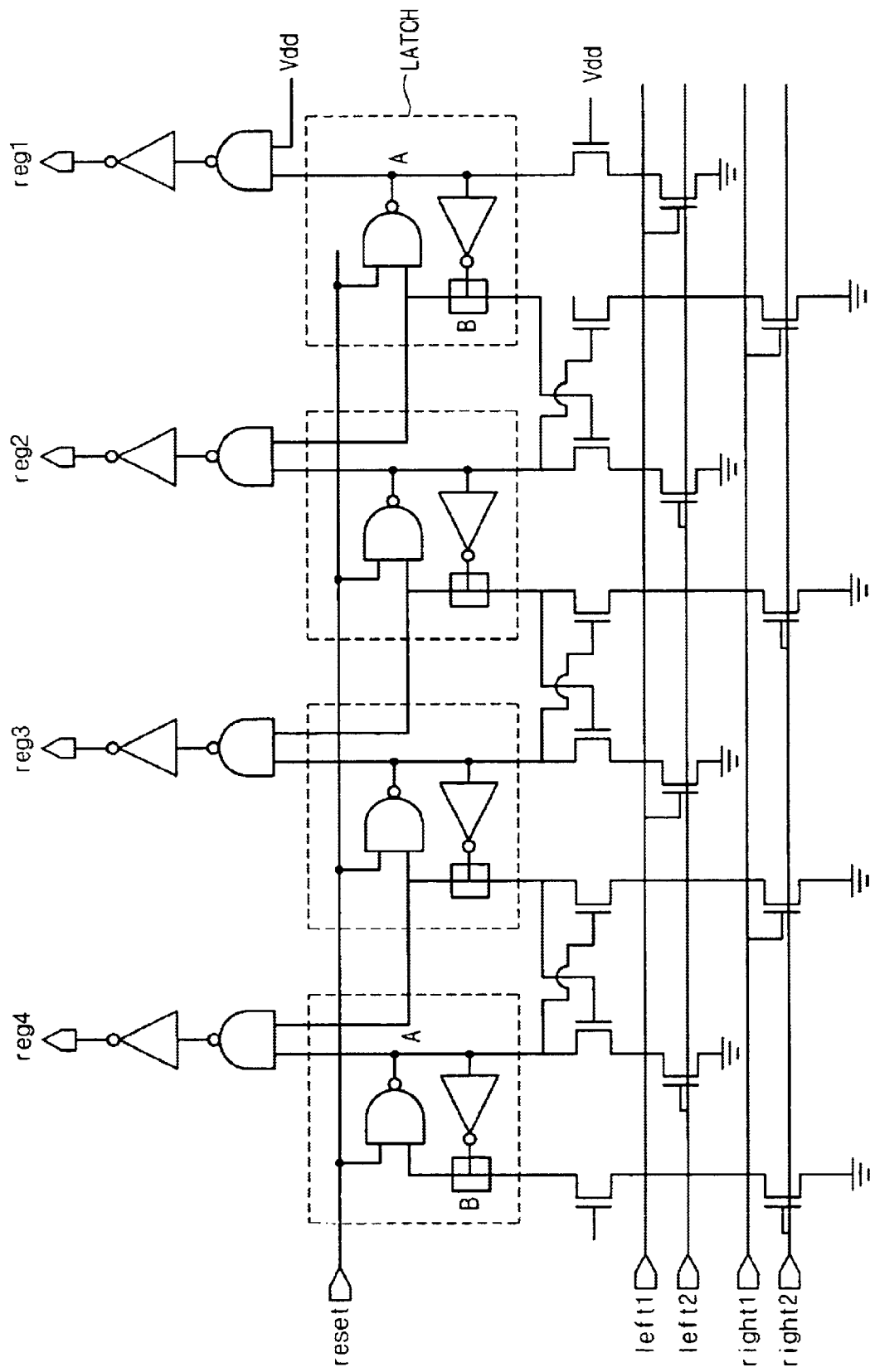
FIG. 4 illustrates an example of a delay control circuit illustrated in FIG. 1.
Figure 5:
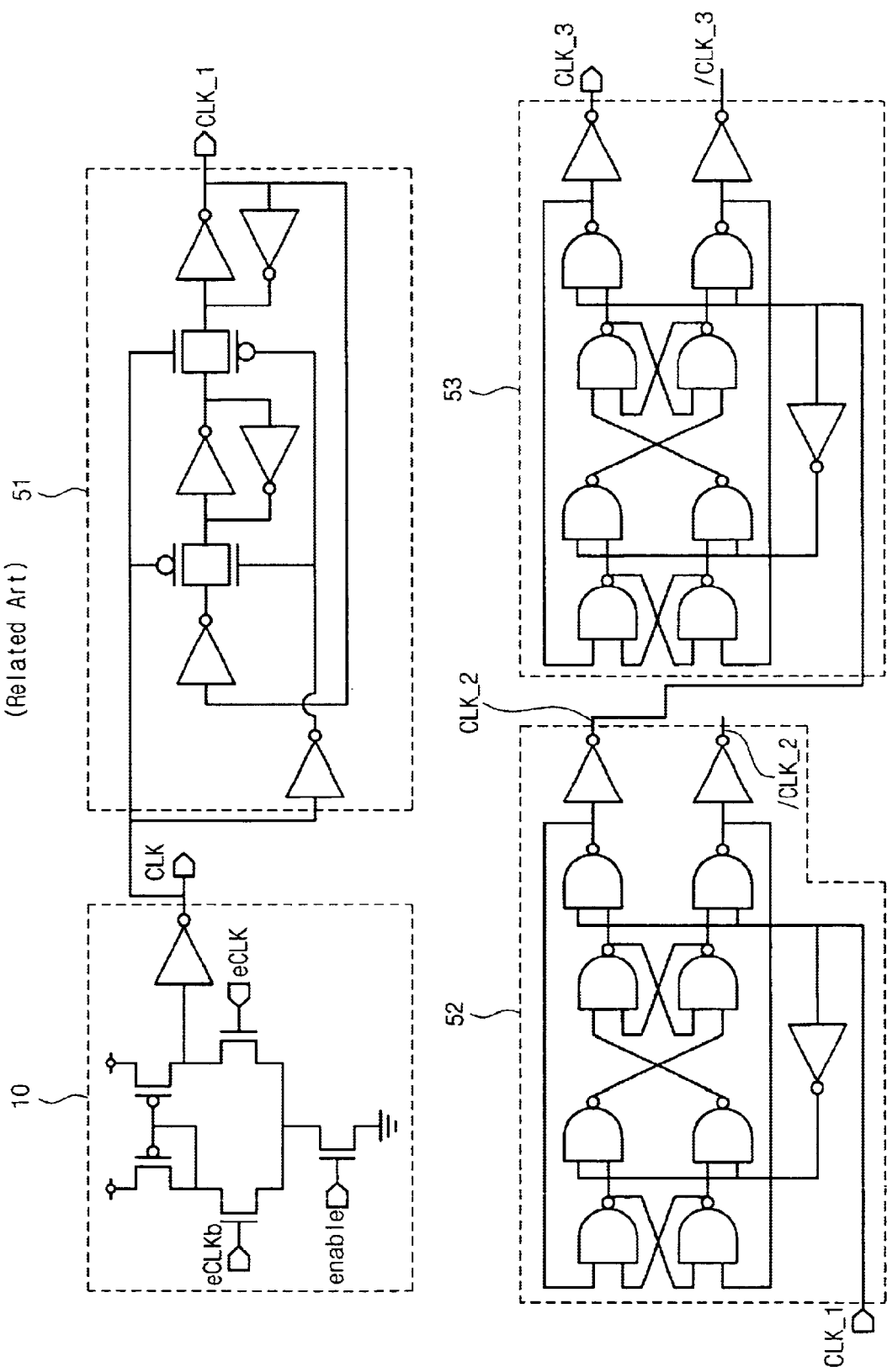
FIG. 5 illustrates an example of a clock buffer and a clock divider illustrated in FIG. 1.
Figure 6:
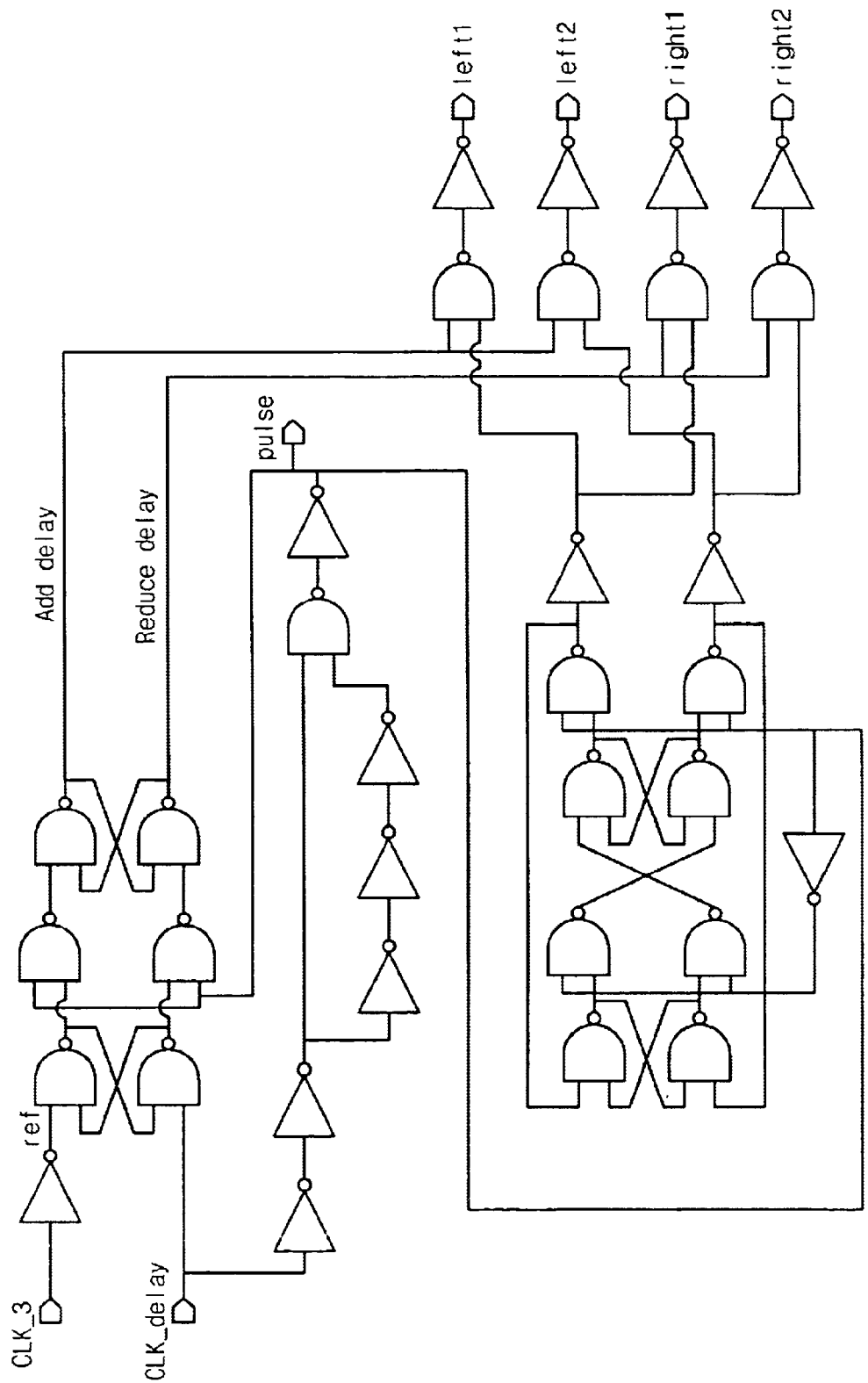
FIG. 6 illustrates an example of a phase comparator illustrated in FIG. 1.
Figure 7:
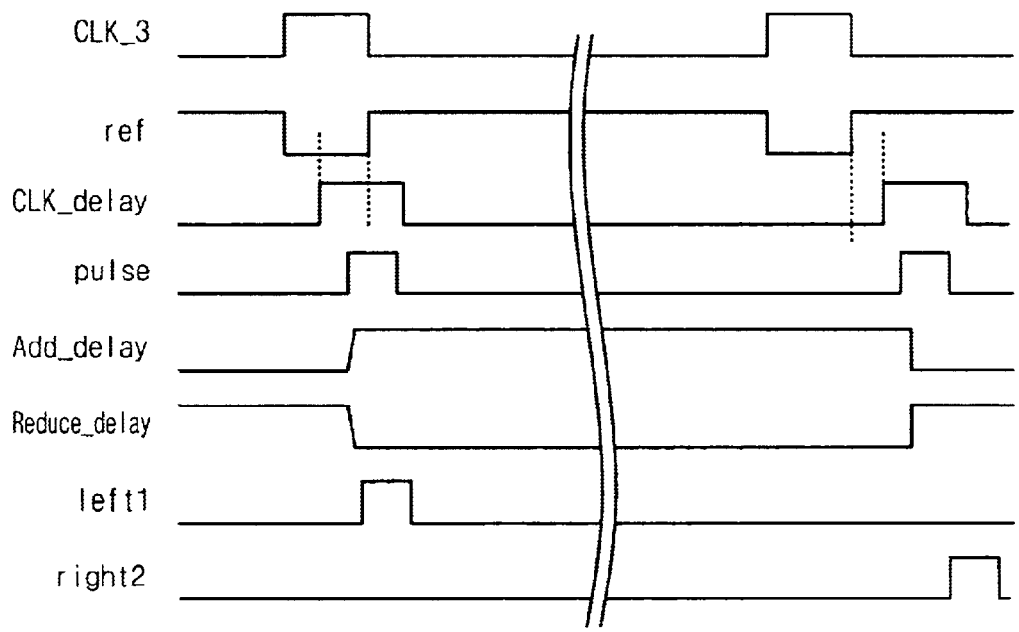
FIG. 7 is a timing diagram of a phase comparator illustrated in FIG. 1.
Figure 8:
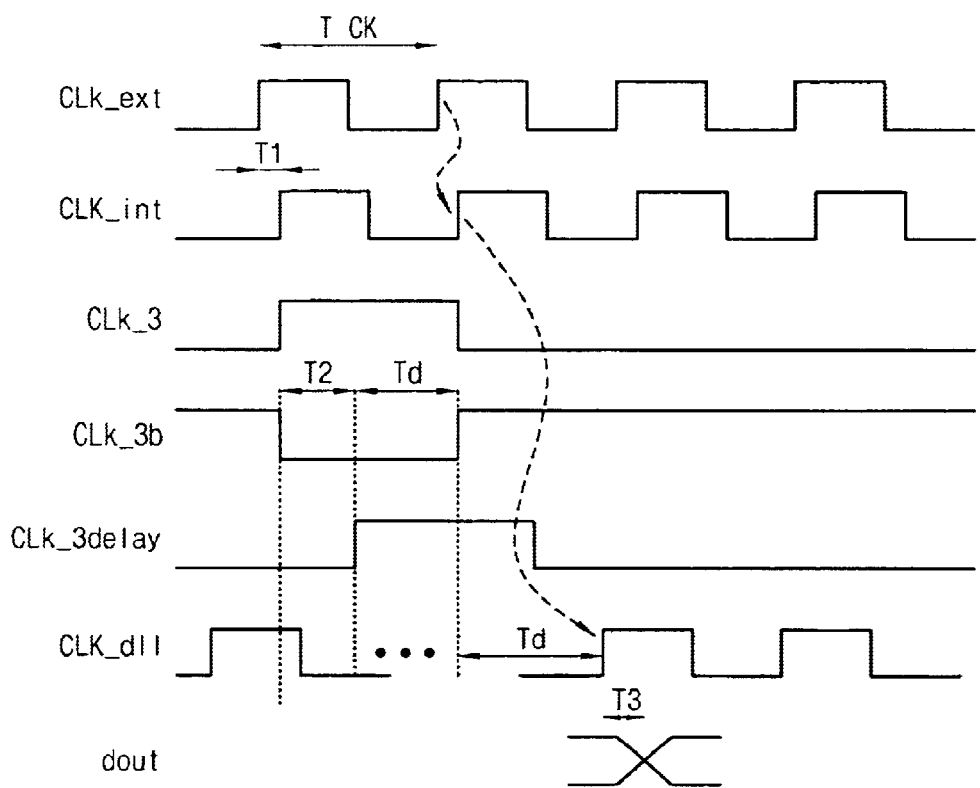
FIG. 8 is a timing diagram of a delay circuit illustrated in FIG. 1.

Hereinafter, preferred embodiments of the present invention will be described with reference to the accompanying drawings. In the following description and drawings, the same reference numerals are used to designate the same or similar components, and so repetition of the description on the same or similar components will be omitted. Also, in the description, the expression of "—the period of the clock signal is short or small—" means that the pulse width of the clock signal is narrow, and "—the period of the clock signal is long—" means that the pulse width of the clock signal is wide.

Figure 9:
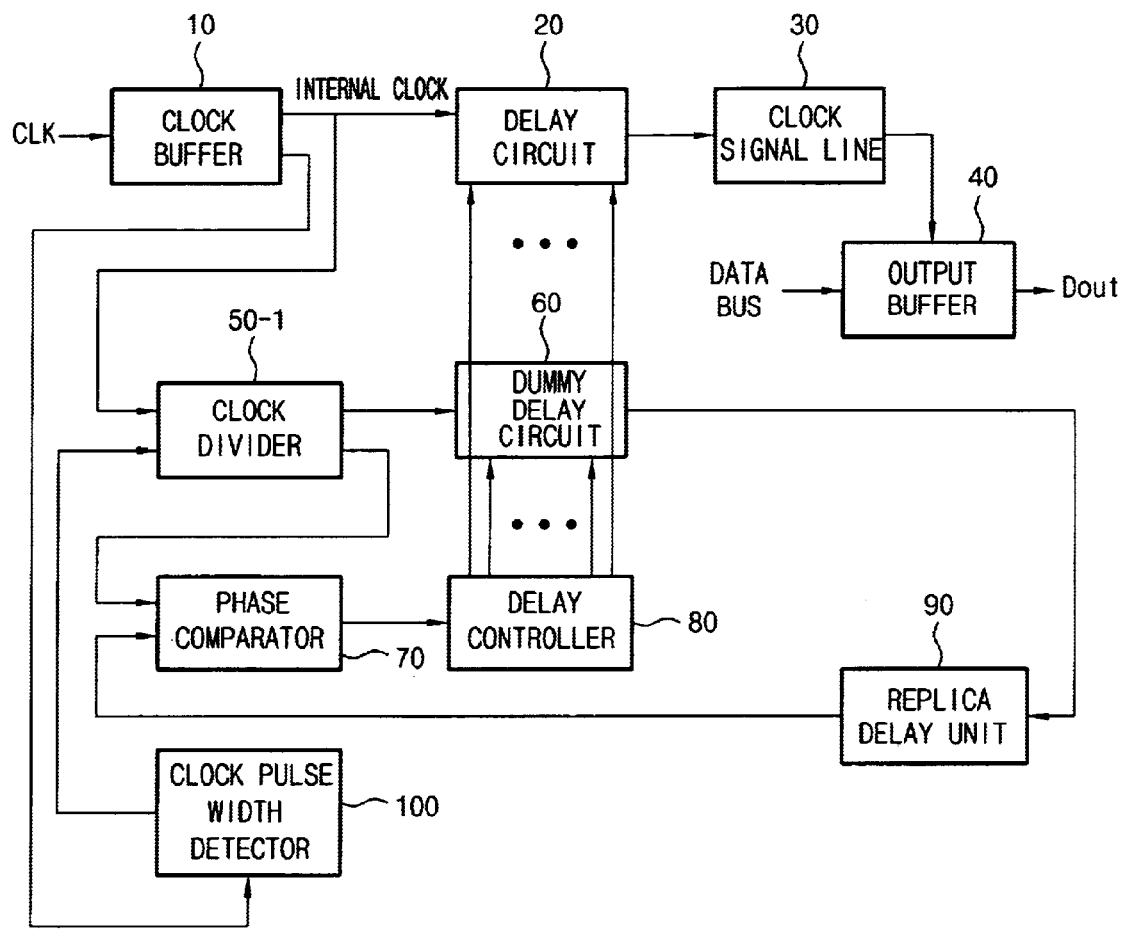
FIG. 9 is a block diagram of a DLL circuit according to the present invention.

FIG. 9 is a block diagram of a DLL circuit according to the present invention.

As shown in FIG. 9, the DLL circuit according to the present invention includes a clock buffer 10 for receiving an external clock signal, a delay circuit 20 for receiving an output signal of the clock buffer 10, a clock divider 50-1 for dividing the output signal of the clock buffer 10, a dummy delay circuit 60 for delaying an output signal of the clock divider 50-1 for a predetermined time, a replica delay unit 90 for delaying an output signal of the dummy delay circuit 60, a phase comparator 70 for comparing a phase of an output signal of the replica delay unit 90 with a phase of the output signal of the clock divider 50-1, a delay controller 80 for receiving an output signal of the phase comparator 70 and controlling delay operations of the delay circuit 20 and the dummy delay circuit 60, a clock signal line 30 for receiving an output signal of the delay circuit 20 and controlling a data output of an output buffer 40, and a clock pulse width detector 100 for receiving the output signal of the clock buffer 10 and detecting a pulse width of the clock signal.

The DLL circuit according to the present invention has many parts similar to those of the conventional DLL circuit, but, as distinct from the conventional DLL circuit, is provided with the clock pulse width detector 100. Also, since the clock divider 50-1 according to the present invention receives an output signal of the clock pulse width detector 100, its construction is different from that of the conventional DLL circuit.

Hereinafter, the construction and function of the clock pulse width detector 100 and the clock divider 50-1 will first be explained, and then the whole operation of the present invention will be explained.

Figure 11:
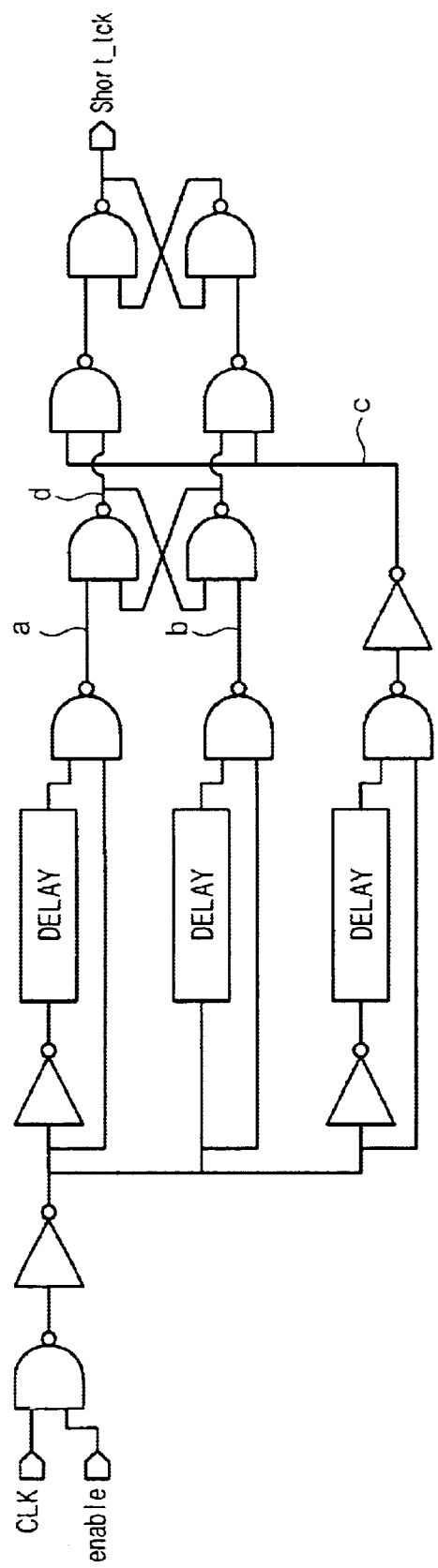
FIG. 11 illustrates an example of a clock pulse width detector used in the DLL circuit according to the present invention.
Figure 12:
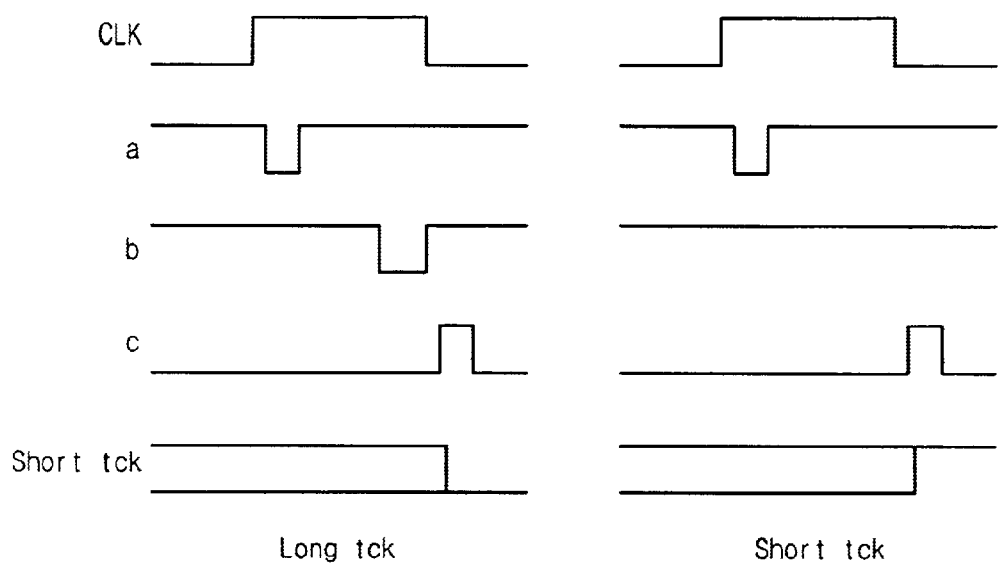
FIG. 12 is a timing diagram of a clock pulse width detector illustrated in FIG. 11.

FIG. 11 illustrates an example of the clock pulse width detector used in the DLL circuit according to the present invention, and FIG. 12 is a timing diagram of the clock pulse width detector illustrated in FIG. 11.

As illustrated in FIGS. 11 and 12, the clock pulse width detector receives a clock signal, delays the clock signal several times and then selectively outputs a logical low or high-level signal through a latch circuit.

In operation, if the clock signal is inputted, a low-level pulse signal 'a' is generated after a predetermined time delay. If the high-level pulse width of the clock signal exceeds the predetermined delay time (i.e., exceeds a delay time through a delay 2), a low-level pulse signal is generated at a node b, and if the high-level pulse width of the clock signal is less than the predetermined delay time (i.e., below the delay time through the delay 2), the node b is kept in a high level.

In summary, if the pulse width of the input clock signal is longer than the predetermined delay time, the node b outputs the low-level pulse signal, and if the pulse width of the clock signal is shorter than the predetermined delay time, the node b is kept in the high level.

As shown in FIGS. 11 and 12, if the pulse width is longer than the predetermined delay time, the clock pulse width detector outputs a low-level signal, while if the pulse width is narrower than the predetermined delay time, the clock pulse width detector outputs a high-level signal. In the embodiment of the present invention, the external input clock and the output signal of the clock buffer have the same period and the same duty rate, and the duty rate is 50%. Also, the clock pulse width detector uses the high-level pulse width of the output signal of the clock buffer in order to detect whether the period of the output signal of the clock buffer exceeds the predetermined delay time.

Figure 10:
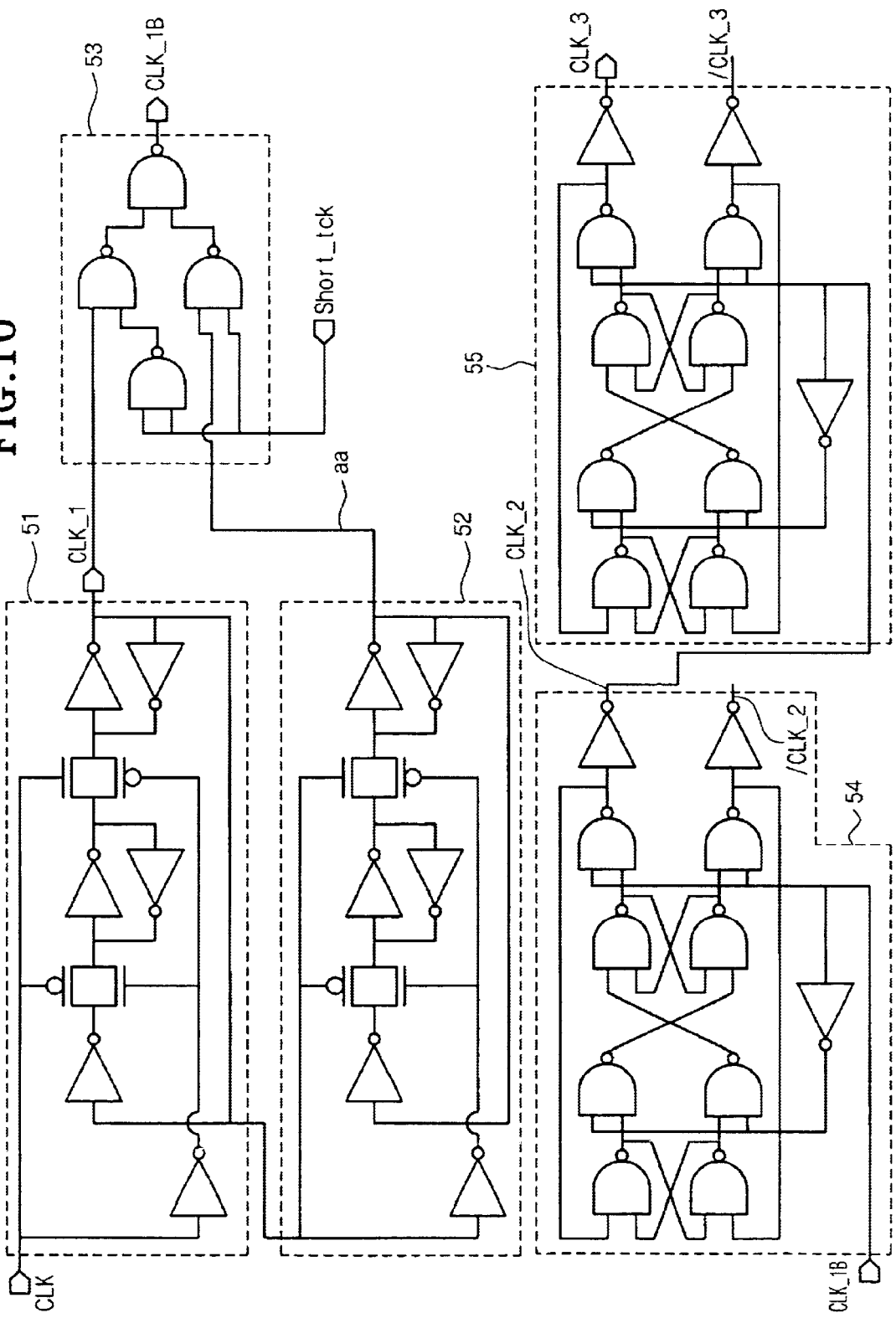
FIG. 10 illustrates an example of a clock divider used in the DLL circuit according to the present invention.

FIG. 10 illustrates an example of a clock divider used in the DLL circuit according to the present invention.

As illustrated in FIG. 10, the clock divider 50-1 includes a plurality of dividers 51, 52, 54 and 55. A multiplexer 53 is a switching means which selects one among the output signals of the two dividers 51 and 52.

Under the control of the multiplexer 53, the dividers are connected in the order of 51-52-54-55 or in the order of 51-54-55. An output signal of the clock pulse width detector is used as the control signal Short_tck of the multiplexer 53. If the pulse width (or period) of the clock signal CLK applied to the clock divider is wide, the output signal of the divider 51 is selected through the multiplexer 53, and if the pulse width (or period) of the clock signal CLK applied to the clock divider is narrow, the output signal of the divider 52 is selected through the multiplexer 53.

In FIG. 10, the divider 51 outputs a clock signal CLK_1 obtained by dividing the frequency of the clock signal CLK into ½. The divider 52 outputs a clock signal aa obtained by dividing the frequency of the clock signal CLK_1 into ½. Thus, the frequency of the output signal aa of the divider 52 is ¼ of the frequency of the clock signal CLK.

The signal inputted to the divider 54 is the output signal of the divider 51 or the output signal of the divider 52, and the signal inputted to the divider 55 is an output signal of the divider 54.

Accordingly, the frequency of the signal outputted through the clock divider is ⅛ or 1/16 of the frequency of the clock signal CLK inputted to the clock divider.

The duty rates of the output signals of the dividers 5, 52, 54 and 55 are not identical, but it is possible to modify the duty rates if needed.

As described above, if the frequency of the external input clock is lower than the reference set value, the clock divider outputs the first divided signal (i.e., in FIG. 11, 1/16-divided signal), and if the frequency of the external input clock is higher than the reference set value, the clock divider outputs the second divided signal (i.e., in FIG. 11, ⅛-divided signal).

Figure 13:
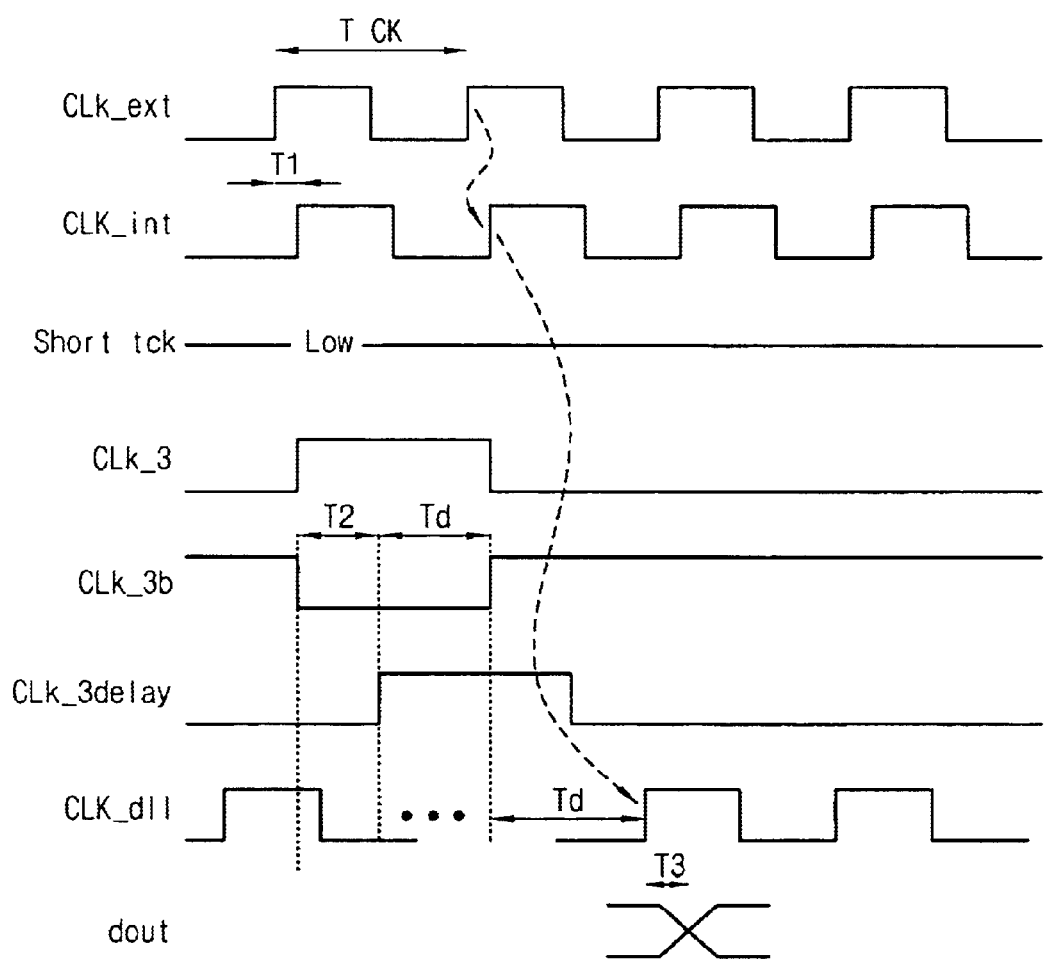
FIG. 13 is a timing diagram of the DLL circuit according to the present invention in the case that the period of the input clock signal is long.

FIG. 13 is a timing diagram of the DLL circuit according to the present invention in the case where the period of the input clock signal is long.

In FIG. 13, TCK denotes the period of the clock signal, and T1 denotes a delay time occurring as the externally inputted clock passes through the clock buffer.

T2 denotes a delay time occurring from the input of the external clock to the output of the data, and is the same as the delay time of the delay unit 90.

Td denotes a delay time which should be adjusted in the delay circuit 20 by the delay controller 80.

CLK_DLL denotes the output signal of the clock signal line 30 which controls the data output buffer 40, and dout denotes data which is outputted from the data output buffer 40.

CLK_3 and CLK_3b denote final output signals of the clock divider, and CLK_3delay denotes the output signal of the replica delay unit. If the period of the input clock signal is long, the clock divider uses only the dividers 51, 54 and 55, and thus the frequency of the final output signals becomes ⅛ of the frequency of the clock signal inputted to the clock divider. For reference, in FIG. 13, the expression of "if the period of the input clock signal is long' means that the period of the clock signal TCK is wider than T2.

Figure 14:
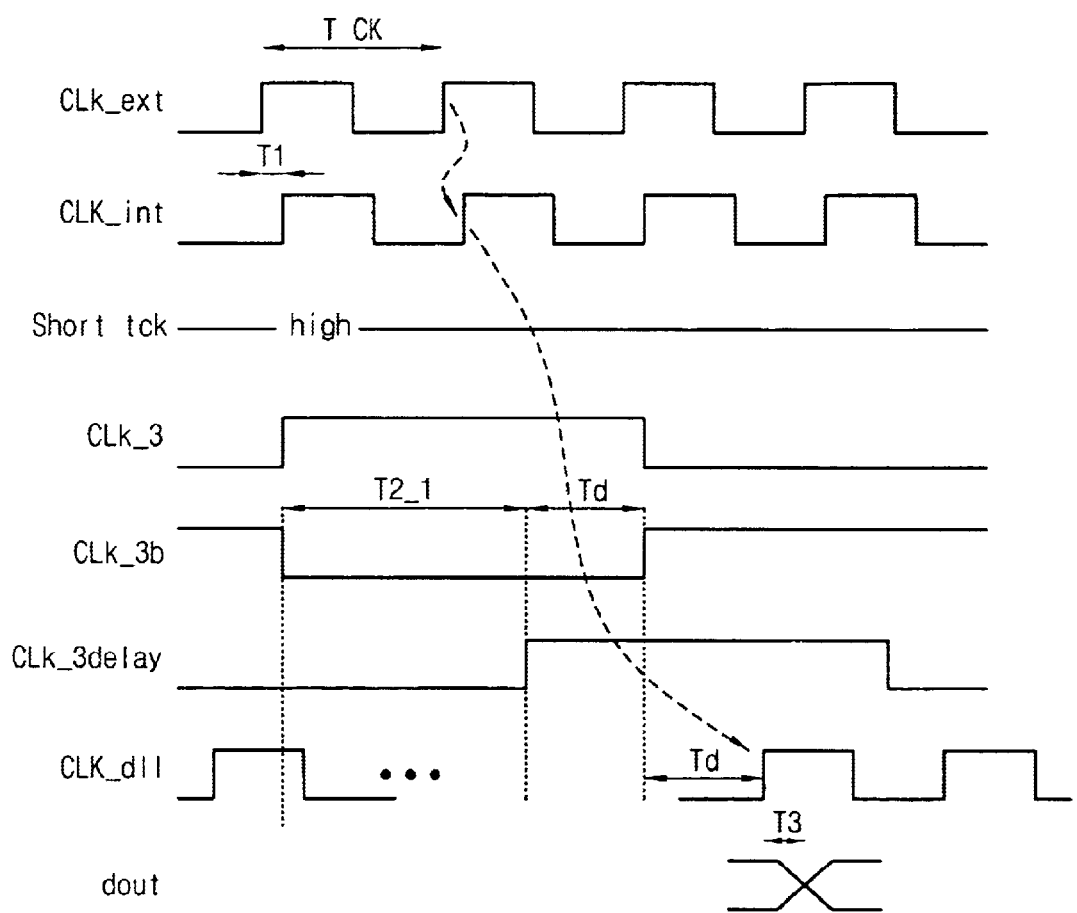
FIG. 14 is a timing diagram of the DLL circuit according to the present invention in the case that the period of the input clock signal is short.

FIG. 14 is a timing diagram of the DLL circuit according to the present invention in the case where the period of the input clock signal is short. In this case, the period TCK of the external input clock is shorter than the time T2_1 taken from the input of the external clock to the output of the data. In this case, the clock pulse width detector 100 detects that the period of the input clock is short, and outputs a high-level signal.

If the period of the input clock signal is short, the clock divider uses the dividers 51, 52, 54 and 55, and thus the frequency of the final output signal is 1/16 of the frequency of the clock signal inputted to the clock divider. Accordingly, the frequency of the final output signals CLK_3 and CLK_3b of the clock divider becomes 1/16 of the frequency of the external input clock. In this case, the high-level pulse width of the final output signals CLK_3 and CLK_3b is 2TCK as shown in FIG. 14. Accordingly, even if the period of the external input clock is short, the DLL circuit can normally operate.

As described above, according to the present invention, since the period of the clock inputted to the clock divider is lengthened four times, and then the clock is divided through the dividers 54 and 55, it is possible for the phase comparator 70 to perform a phase comparison and for the delay controller 80 to control the dummy delay circuit 60 and the delay circuit 20, and thus the DLL circuit can normally operate even if the period of the external input clock is short.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A DLL (Delay Lock Loop) circuit which synchronizes an external input clock applied from an outside of a system with an internal input clock used inside the system using a divider unit, the DLL circuit comprising:

a detection unit for detecting whether a pulse width of the external input clock is narrower or wider than a reference set value;

wherein the divider unit outputs a first divided signal when it is detected that the pulse width of the external input clock is wider than the reference set value, and outputs a second divided signal when it is detected that the pulse width of the external input clock is shorter than the reference set value.

2. The DLL circuit as claimed in claim 1, wherein a pulse width of the first divided signal is narrower than a pulse width of the second divided signal.

3. A DLL (Delay Lock Loop) circuit which synchronizes an external input clock applied from an outside of a system with an internal input clock used inside the system, the DLL circuit comprising:

a buffer means for receiving and buffering the external input clock;

a detection means for detecting whether a period of an output signal of the buffer means exceeds a first delay time; and a divider means for receiving the output signal of the buffer means and an output signal of the detection means and dividing frequencies of the output signals;

wherein when the period of the output signal of the buffer means exceeds the first delay time, the detection means outputs a first logic level, and the divider means outputs a signal having a frequency obtained by dividing the frequency of the output signal of the buffer means into $\frac{1}{2}^M$ (where, M is an integer); and wherein when the period of the output signal of the buffer means does not exceed the first delay time, the detection means outputs a second logic level, and the divider means outputs a signal having a frequency obtained by dividing the frequency of the output signal of the buffer means into $\frac{1}{2}^{M+1}$.

4. The DLL circuit as claimed in claim 3, wherein the first delay time is determined in consideration of a time taken from an input of the external input clock to an output of data from the system which uses the DLL circuit under the control of the DLL circuit.

5. The DLL circuit as claimed in claim 3, wherein the external input clock and the output signal of the buffer means have the same period and the same duty rate, and the duty rate is 50%; and wherein the detection means uses a high-level pulse width of the output signal of the buffer means in order to detect whether the period of the output signal of the buffer means exceeds the first delay time.

6. A DLL (Delay Lock Loop) circuit comprising:

a clock buffer for receiving an external clock signal;

a first delay unit for receiving an output signal of the clock buffer;

a clock divider for dividing the output signal of the clock buffer;

a second delay unit for delaying an output signal of the clock divider for a predetermined time;

a third delay unit for delaying an output signal of the second delay unit;

a phase comparator for comparing a phase of an output signal of the third delay unit with a phase of the output signal of the clock divider;

a delay controller for receiving an output signal of the phase comparator and controlling delay operations of the first delay unit and the second delay unit;

a clock signal line for receiving an output signal of the first delay unit and controlling a data output of a data output buffer; and a clock pulse width detector for receiving the output signal of the clock buffer and detecting a pulse width of the clock signal;

wherein the signal outputted from the clock divider under the control of an output signal of the clock pulse width detector has different divided states.

7. The DLL circuit as claimed in claim 6, wherein when the period of the output signal of the clock buffer exceeds a first delay time, the clock pulse width detector outputs a first logic level, and the clock divider outputs a signal having a frequency obtained by dividing the frequency of the output signal of the clock buffer into $\frac{1}{2}^M$ (where, M is an integer); and wherein when the period of the output signal of the clock buffer does not exceed the first delay time, the clock pulse width detector outputs a second logic level, and the clock divider outputs a signal having a frequency obtained by dividing the frequency of the output signal of the clock buffer into $\frac{1}{2}^{M+1}$.

8. The DLL circuit as claimed in claim 7, wherein the first delay time is determined in consideration of a time taken from an input of the external input clock to an output of data from the system which uses the DLL circuit under the control of the DLL circuit.

* * * * *